United States Patent
Saito

(10) Patent No.: US 6,548,889 B2
(45) Date of Patent: Apr. 15, 2003

(54) HYDROGEN GETTER FOR INTEGRATED MICROELECTRONIC ASSEMBLY

(75) Inventor: Yoshio Saito, Westchester, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 10/042,399

(22) Filed: Jan. 8, 2002

(65) Prior Publication Data
US 2002/0063323 A1 May 30, 2002

Related U.S. Application Data

(60) Continuation of application No. 09/285,596, filed on Apr. 2, 1999, now Pat. No. 6,369,442, which is a division of application No. 09/206,271, filed on Dec. 4, 1998, now Pat. No. 6,110,808.

(51) Int. Cl.$^7$ ................................. H01L 23/20
(52) U.S. Cl. ................ 257/682; 257/680; 257/704; 257/721; 257/729
(58) Field of Search ................. 257/682, 680, 257/704, 721, 729

(56) References Cited

U.S. PATENT DOCUMENTS

| | | | | |
|---|---|---|---|---|
| 5,431,745 A | * | 7/1995 | Koschlig et al. | 148/24 |
| 5,491,361 A | * | 2/1996 | Stupian et al. | 257/680 |
| 5,532,031 A | * | 7/1996 | Farooq et al. | 428/623 |
| 5,805,427 A | * | 9/1998 | Hoffman | 361/770 |
| 5,861,665 A | * | 1/1999 | Derkits et al. | 257/682 |
| 5,866,077 A | * | 2/1999 | Sakurai et al. | 422/174 |
| 6,056,831 A | * | 5/2000 | Egitto et al. | 148/241 |

* cited by examiner

Primary Examiner—David L. Talbott
Assistant Examiner—Luan Thai
(74) Attorney, Agent, or Firm—Antonelli, Terry, Stout & Kraus, LLP

(57) ABSTRACT

Disclosed are a packaging component for packaging a microelectronic (e.g., III–V semiconductor) device, the packaged microelectronic device, and methods for manufacture thereof. The component has sequentially deposited layers of metal (37, 50), to be located within the package, to act as a hydrogen getter. The sequentially deposited layers of metal include at least a first layer (3) of Ni adjacent the housing member surface, to improve adherence of the sequentially deposited layers and interstitially trap hydrogen; an outermost layer (11) of palladium to convert molecular hydrogen to hydrogen atoms and to absorb hydrogen; and a layer (9) of Ti or Zr adjacent this outermost layer. Additional layers (5, 7) of nickel and of titanium or zirconium can be provided between the first layer and the layer adjacent the outermost layer. Desirably, the surface of the housing member is roughened prior to depositing the first layer thereon.

39 Claims, 3 Drawing Sheets

US 6,548,889 B2

HYDROGEN GETTER FOR INTEGRATED MICROELECTRONIC ASSEMBLY

This application is a Continuation application of application Ser. No. 09/285,596, filed Apr. 2, 1999, Pat. No. 6,369,442, which is a Divisional application of application Ser. No. 09/206,271, filed Dec. 4, 1998, Pat. No 6,110,808.

BACKGROUND OF THE INVENTION

The present invention is directed to packaging components (e.g., a lid, a container, etc.) for packaging microelectronic devices (for example, semiconductor devices), packages (assemblies) formed using these packaging components (e.g., to form integrated microelectronic assemblies), and methods of forming the packaging components and packages. The present invention is especially directed to packaging components and packages formed utilizing such components, and methods for forming such components and such packages, which avoid damage and degradation of the microelectronic devices in such packages, due to hydrogen in the package. Thus, the present invention is directed to packaging components and packages, having hydrogen gettering structure, which avoid hydrogen degradation of packaged devices, particularly those devices having a low threshold hydrogen level in the hermetic (airtightly sealed) package.

A problem experienced by semiconductor manufacturers, in connection with packaged semiconductor devices, is hydrogen degradation of the devices in hermetically sealed package. The hydrogen within the package can be generated from various parts of the package (for example, from housing materials, plated nickel layers, Eccosorb (a material used in semiconductor packages of, e.g., millimeter wave integrated circuits, to absorb electrical signals), epoxy adhesives, etc.).

This problem of hydrogen degradation is particularly acute with devices such as pseudomorphic high electron mobility transistors (PHEMTs) of monolithic millimeter wave integrated circuits (MMICs). Because these devices have thin nitride passivation layers, they are especially sensitive to hydrogen degradation, and a threshold hydrogen level in hermetic packages of these types of devices is very low, for example, about 100 ppm. However, such PHEMTs of MMICs are not the only types of devices particularly sensitive to hydrogen degradation; for example, MESFETs and indium phosphide high electron mobility transistors are other types of devices that are especially sensitive to hydrogen degradation and have very low threshold hydrogen levels in the hermetically-sealed package.

It has been proposed to mitigate the problem of hydrogen degradation, by baking out housing materials prior to populating the microelectronic device in the package and then sealing. While this has been successful in some instances, such technique to mitigate the problem of hydrogen degradation has not been sufficient, particularly with devices having a low hydrogen threshold level.

Another technique to overcome this problem of hydrogen degradation involves suspending inorganic hydrogen-absorbing material in silicone, in the device package. The inorganic hydrogen absorption material can be any of known metal oxide hydrogen getters. However, this technique has problems when utilized in packaging, e.g., microelectronic devices. For example, the material used undesirably takes up a large amount of moisture, requiring careful handling during the package sealing process. In addition, silicone may vaporize and contaminate electronic device and laser seal surfaces, and additional problems arise with the packaged device due to mobile impurity ions (for example, $K^+$, $Na^+$, $Cl^-$, etc.) introduced due to this inorganic hydrogen absorption material in silicone in the package.

SUMMARY OF THE INVENTION

Accordingly, it is an objective of the present invention to provide a packaging component (e.g., a lid, a container, etc.) having hydrogen gettering structure which is stable, does not require activation (as a getter) at high temperatures, and which does not absorb moisture, corrode or actively react with oxygen or moisture.

It is a further objective of this invention to provide a package (i.e., packaged microelectronic device) using this packaging component, and a method of making this packaging component and this package.

It is a further objective of the present invention to provide a packaging component, having hydrogen gettering structure which strongly adheres to a surface of the packaging component, a package formed utilizing such component, and methods of making this component and package.

It is a still further objective of the present invention to provide a packaging component, having hydrogen gettering structure which does not release hydrogen when a package having this component is heated at temperatures below 150° C., and a package using such component and methods of making such component and such package.

The foregoing objects are achieved by the packaging component of the present invention, which includes a housing member and sequentially deposited metal layers attached to the housing member, the sequentially deposited metal layers being positioned within the package when the components of the package are assembled to form the package, this sequentially deposited metal layers including an absorbing layer of a metal for absorbing hydrogen, and an outermost layer (that is, a layer in contact with the environment within the package when the package has been assembled) of a metal that converts hydrogen molecules to hydrogen atoms and also absorbs hydrogen, adjacent to the absorbing layer of metal for absorbing hydrogen, the metal of the outermost layer being of a different metal than the metal of the absorbing layer. Illustratively, and not to be limiting, the metal of the outermost layer is palladium; and the absorbent layer can be made of zirconium or titanium.

Furthermore, in order to improve adherence of the sequentially deposited layers of metal layers to the housing member, as well as to further absorb hydrogen, the sequentially deposited layers of metal layers further includes, in addition to the aforementioned two layers, a first layer of a first metal, different than the metal of the aforementioned two layers, closer to the housing member than are the other two layers, for adhering to the housing member and for trapping hydrogen. This first layer of a first metal (e.g., nickel) has greater adherence to the housing member than the metal (e.g., zirconium or titanium) of the absorbing layer.

This two-layer (or three-layer) sequentially deposited layers of metal layers, the layers respectively being made of different metals, functions as hydrogen gettering structure in the assembled package containing a microelectronic device (e.g., a semiconductor device).

In some instances, the two-(or three-) layer sequentially deposited layers may provide sufficient hydrogen gettering in the package; however, for acutely sensitive devices, where the hydrogen threshold level is very low (for example, power pseudomorphic high electron mobility transistors of monolithic millimeter wave integrated circuits, or MESFETs, or indium phosphide high electron mobility transistors), the sequentially deposited layers of metal layers preferably further includes at least one further absorbing layer of, e.g., the hydrogen-absorbing metal, e.g., selected from the group consisting of zirconium or titanium, and at least one further first layer, of, e.g., nickel, positioned between the layer (e.g., of nickel) closest to the housing member surface and the layer (e.g., of zirconium or titanium) adjacent the outermost layer.

The present invention also achieves the foregoing objectives through a packaged microelectronic device, including a plurality of components forming a sealed package, these plurality of components including a container for holding the microelectronic device and a lid, the plurality of components including a component containing the aforementioned sequentially deposited layers of metal layers, with the microelectronic device being adhered to a bottom of the container, the lid being sealed to the container by an air-tight seal.

The foregoing objectives are also achieved by a method of fabricating a package component, of a package for packaging a microelectronic device, having the steps of:

(a) providing a housing member of the package;

(b) depositing a first metal, of a metal for absorbing hydrogen, overlaying a surface of the housing member which will be an inside surface of the package; and (c) depositing a second metal layer, which is an outermost layer of metal layers overlaying the surface of the housing member, of a metal that converts hydrogen molecules into hydrogen atoms and absorbs hydrogen, this second metal layer being deposited adjacent the first metal layer and being of a different metal than the metal of the first metal layer.

Illustratively, and not to be limiting, this first metal layer is made of a metal selected from the group consisting titanium or zirconium, and the second metal layer is made of palladium. The first and second metal layers can, illustratively, be deposited by a process of electronbeam evaporation deposition or a process of sputtering.

In order to further achieve the benefits of the present invention, prior to depositing the aforementioned first metal layer, a third metal layer, of a different metal than that of the first and second metal layers, which absorbs hydrogen and has a greater adherence to the housing member (or to a layer adhered to the housing member) than does metal of the first metal layer, is deposited over (e.g., on the housing member, the first metal layer being deposited on the third metal layer.

Desirably, prior to depositing the metal layers, the surface of the housing member upon which the metal layers are to be deposited is roughened, which improves hydrogen absorption efficiency of the sequentially deposited layers of metal layers.

The foregoing objectives are further achieved by a method of packaging a microelectronic device, thereby forming an integrated microelectronic assembly, which includes steps of:

(a) providing packaging components, for packaging the microelectronic device in an air-tight sealed package, including a lid and a container for holding this microelectronic device, the packaging components including a package component with the sequentially deposited layers of metal layers as discussed previously;

(b) providing the microelectronic device;

(c) inserting the microelectronic device in the container; and (d) air-tightly sealing the lid on the container.

Accordingly, through the present invention a package having a hydrogen gettering structure which is stable and has a high pumping speed, does not require activation at high temperature or a vacuum bake, does not absorb moisture, and does not corrode or actively react to oxygen or moisture, is achieved. The metal layers of the sequentially deposited layers can easily and simply be deposited on package components prior to package assembly. The sequentially deposited layers have physical strength and good adherence to the housing member, and provides multiple hydrogen reservoirs for the gettering function. Moreover, with the combination of layers utilized, any formation of powdery hydride can be blocked from contaminating electronic circuits in the package.

DETAILED DESCRIPTION OF THE INVENTION

Figure 1:
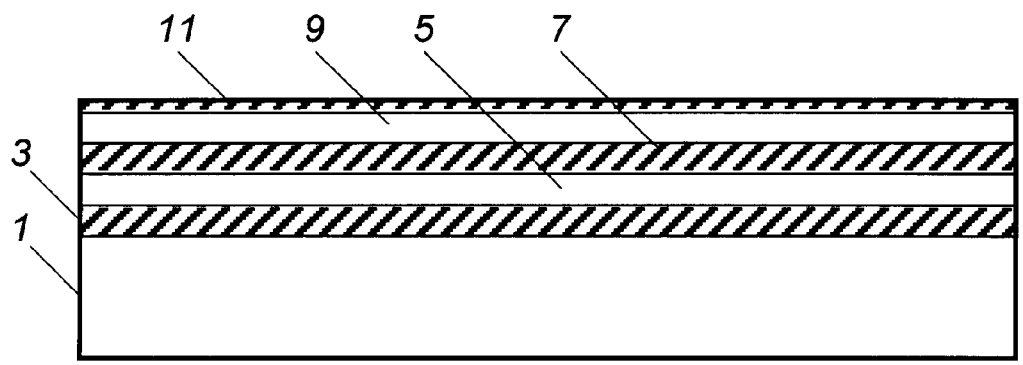
FIG. 1 is a cross-sectional view of the sequentially deposited layers of metal layers of a package component, forming the hydrogen gettering structure of the present invention.

While the present invention will be described in connection with specific and preferred embodiments, it will be understood that it is not intended to limit the invention to those embodiments. To the contrary, it is intended to cover all alterations, modifications and equivalents as may be included within the spirit and scope of the invention as defined by the appended claims.

Throughout the present specification, where structure or processing steps are described as including or comprising specific components or processing steps, it is contemplated by the present inventor that the structure also consists essentially of, or consists of, the recited components; and that the process also consists essentially of, or consists of, the recited processing steps. Accordingly, throughout the present disclosure any described structure can consists essentially of, or consist of, the recited components; and any described process can consist essentially of, or consist of, the recited processing steps.

The present invention contemplates packaging components for a packaged microelectronic device, the packaged microelectronic device (i.e., integrated microelectronic assembly), and methods for forming the packaging component and the packaged device, all achieving improved hydrogen gettering structure. The improved hydrogen gettering structure includes sequentially deposited layers of metal layers attached to a surface of a housing member (e.g., attached to surfaces of a container or a lid) to be inside the package when the package is sealed, this sequentially deposited layers of metal layers including a combination of various metal layers of different metals that absorb and/or trap hydrogen, thereby providing multiple hydrogen reservoirs which retain the hydrogen up to relatively high temperatures. The different metals have different equilibrium constants for hydrogen.

The outermost layer of this sequentially deposited layers of layers (that is, the layer furthest from the surface of the housing member supporting the sequentially deposited layers, e.g., which outermost layer is exposed to the environment within the package) is the primary absorber of hydrogen of the sequentially deposited layers. This outermost layer is of a metal (for example, palladium) which converts molecular hydrogen to atomic hydrogen and absorbs the hydrogen atoms.

Adjacent this outermost layer, in a direction toward the supporting surface of the housing member, is a layer of material acting as a secondary hydrogen absorber in the sequentially deposited layers of metal layers. This secondary hydrogen absorber, which, illustratively and not limiting, can be of titanium or of zirconium metal, forms hydrides with the hydrogen. Due to formation of the hydrides, which in powdery form may contaminate electronic circuits in the package, the titanium cannot be used by itself. However, this layer adjacent the outermost layer provides advantages in that it retains hydrogen atoms to higher temperatures than does, e.g., palladium of the outermost layer, and absorbs greater amounts of hydrogen atom than does the palladium.

Desirably, between the secondary hydrogen absorber and the surface of the housing member, e.g., in contact with the housing member, is a metal adhesion-promoting layer (e.g., of nickel), which traps hydrogen interstitially and provides better adhesion to the surface of the housing member than does structure wherein the metal of the secondary hydrogen absorber is directly adhered to the surface of the housing member. While the nickel traps hydrogen interstitially, it gives up the hydrogen at a higher temperature than does the material of the secondary hydrogen absorber.

As can be seen from the foregoing, each of the layers of the sequentially deposited layers of metal layers contributes advantages to the structure as a hydrogen gettering material. Thus, by use of the different metals, which have different equilibrium constants (or solubility) for hydrogen, a multiple hydrogen reservoir having advantageous hydrogen gettering, while avoiding damage to characteristics of the device, can be achieved.

The sequentially deposited layers of metal layers can be provided directly on the housing member, with, e.g., the nickel directly in contact with, and adhering to, the surface of the housing member. However, the sequentially deposited layers of metal layers need not be directly on the surface of the housing member. The sequentially deposited layers of metal layers can be attached to the housing member by an adhesive; for example, but not to be limiting, the sequentially deposited layers of the metal layers as discussed previously can be formed on an aluminum sheet (e.g., an Al sheet that is 10 mil thick), with the aluminum sheet being adhered to the housing member by an adhesive.

In certain instances, where levels of hydrogen gettering need not be extremely high, sequentially deposited layers of the aforementioned three layers may be sufficient. If additional hydrogen gettering is necessary, additional layers of the material of the secondary hydrogen absorber (e.g., titanium or zirconium) and of the metal of the first layer for adhering to the housing member surface (e.g., nickel), can be provided between the innermost layer closest to the housing member surface and the layer of the secondary hydrogen absorber adjacent the outermost layer, to increase the reservoir for hydrogen absorption and provide increased hydrogen gettering function. For example, at least one additional layer of titanium and at least one additional layer of nickel can be provided between the nickel layer closest to the housing member surface and the titanium or zirconium absorbing layer adjacent the outermost layer, these layers of titanium and nickel being alternately positioned with a layer of titanium adjacent the innermost nickel layer, to increase the hydrogen reservoir and increase hydrogen gettering function while, e.g., avoiding peeling off of the layers which can occur if too thick a titanium layer is formed. Thus, these multiple layers make for an increased reservoir, while avoiding stress (for example, stress caused differences in lattice parameters in the multiple layers) due to an excessively thick titanium layer.

While the foregoing describes the additional layers as being alternately disposed, this is merely illustrative, and these additional layers can be in any order.

Illustratively, and not to be limiting, the different layers of the sequentially deposited layers of metal layers of the hydrogen gettering structure have the following thicknesses. Thus, when used, the first layer of the metal sequentially deposited layers (e.g., nickel), closest to the surface of the housing member, which improves adherence, can have a thickness in a range of 300–1,000 Å. Each additional layer of metal of this first layer (e.g., each additional layer of nickel), when utilized, can have a thickness in a range of 1,000–5,000 Å. The layer of the secondary hydrogen absorber (e.g., titanium or zirconium), adjacent the outermost layer, can have a thickness of 3,000–10,000 Å, and the outermost layer (the primary hydrogen absorber) of, e.g., palladium, can have a thickness of 300–1000 Å. When additional layers of the secondary hydrogen absorber are used, each additional layer can have a thickness of 3,000–10,000 Å.

Care should be taken that each titanium layer formed be not too thick; otherwise, it may peel off.

The housing can be made of material conventionally utilized in packaging microelectronic devices, such as pseudomorphic high electron mobility transistors of monolithic millimeter wave integrated circuits. Thus, the housing can be made of any ferrous alloy or aluminum alloy, or of a ceramic material (such as alumina). These materials can be utilized for the container or lid, e.g., as housing members.

The sequentially deposited layers of metal layers providing the hydrogen gettering function can be located, for example, attached to interior surfaces of the container or the interior surface of the lid. Exact positioning of the sequentially deposited layers of metal layers is not critical.

FIG. 1 shows a cross section of the sequentially deposited layers of metal layers, according to an aspect of the present invention. Thus, housing member 1 can be a portion of the container or a portion of the lid, of the device package. Housing member 1 can be made of any of the previously mentioned materials (for example, it can be made of an aluminum alloy designated as Al #4047). Nickel layer 3 is the nickel layer provided adjacent the housing member 1, for improving adherence of the sequentially deposited layers d structure as compared to, e.g., where a titanium layer is provided adjacent to the housing member surface. Reference character 11 represents she outermost layer of, e.g., palladium, which is the primary hydrogen absorber, and reference character 9 represents the layer of secondary hydrogen absorber (e.g., titanium).

In the embodiment shown in FIG. 1, two additional layers are provided as part of the sequentially deposited layers. That is, reference characters 5 and 7 respectively represent an additional titanium layer and an additional nickel layer, respectively, providing increased hydrogen reservoir for the hydrogen gettering structure.

The following example further describes and demonstrates the present invention. This example is given solely for the purpose of illustration and is not to be construed as a limitation of the invention. Many variations thereof are possible without departing from the spirit and scope of the present invention. In connection with this example, reference is made to the structure shown in FIG. 1. Thus, a lid according to the present invention (a portion of which is shown as housing member 1 in FIG. 1), of aluminum alloy Al #4047, had the following layers deposited thereon, as sequentially deposited layers of metal layers for providing a hydrogen gettering function. A 500 Å thick nickel (layer 3 in FIG. 1) is provided adjacent the surface of the lid. A 5,000 Å thick titanium layer (layer 5 in FIG. 1) was then deposited adjacent this nickel layer, and a 5,000 Å thick intermediate nickel layer (layer 7 in FIG. 1) was then deposited adjacent the titanium layer. A 10,000 Å thick titanium layer (layer 9 in FIG. 1) was then provided adjacent the intermediate nickel layer, and thereafter a 500 Å thick palladium layer was provided as the outermost layer of the sequentially deposited layers of metal layers. When incorporated into a package for packaging a microelectronic device, the sequentially deposited layers of metal layers provided on the lid achieved excellent hydrogen gettering results.

Figure 2:
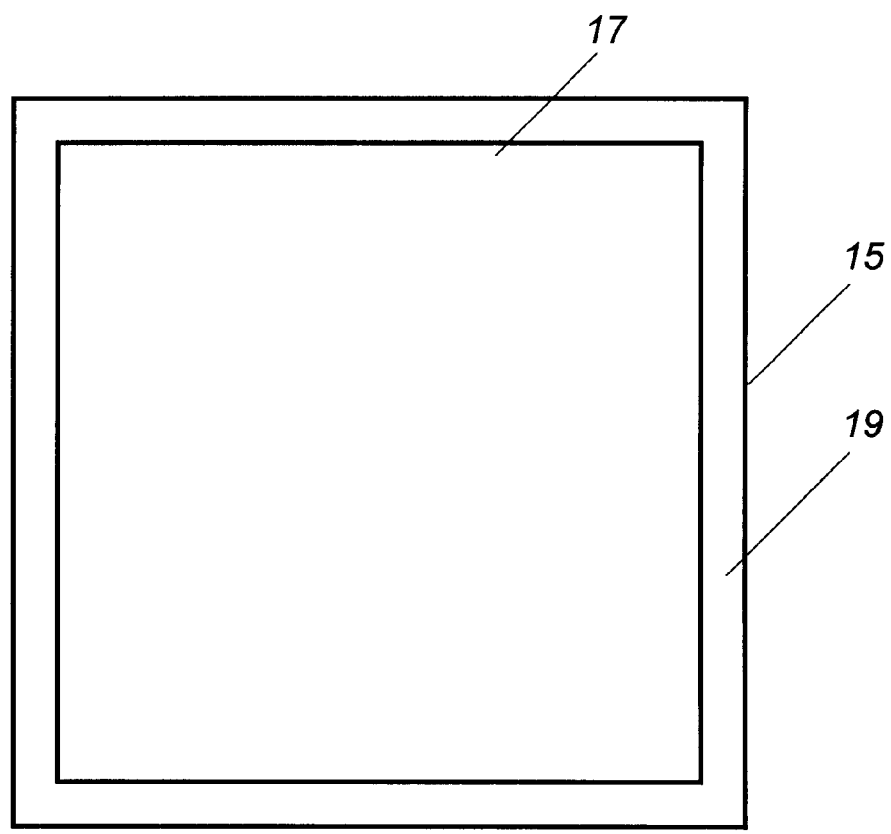
FIG. 2 is a plan view of sequentially deposited layers of metal layers on a lid of a device package, according to the present invention.

FIG. 2 is a plan view of a lid carrying the sequentially deposited layers of metal layers according to the present invention. Thus, lid 15, of, e.g., aluminum, has the sequentially deposited layers 17 of metal layers.

Figure 3:
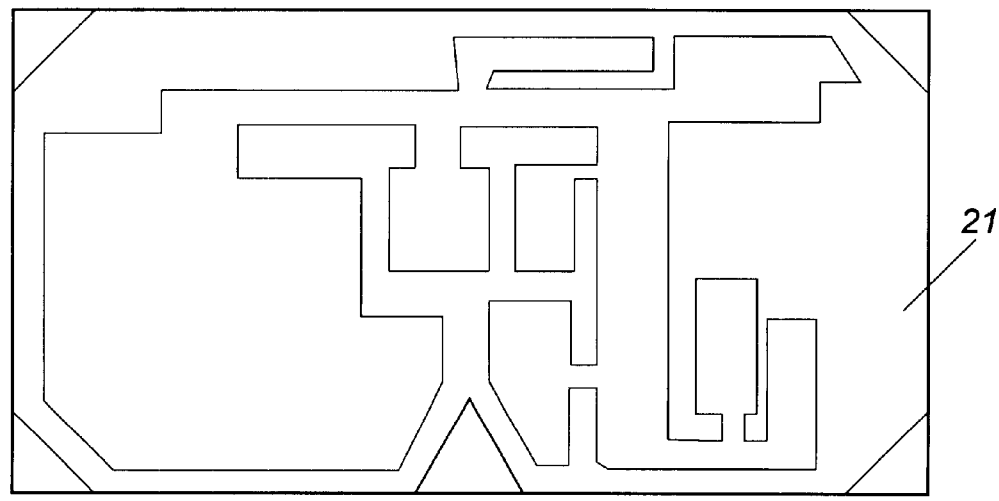
FIG. 3 is a top view of a container of an integrated microelectronic assembly according to the present invention.
Figure 4:
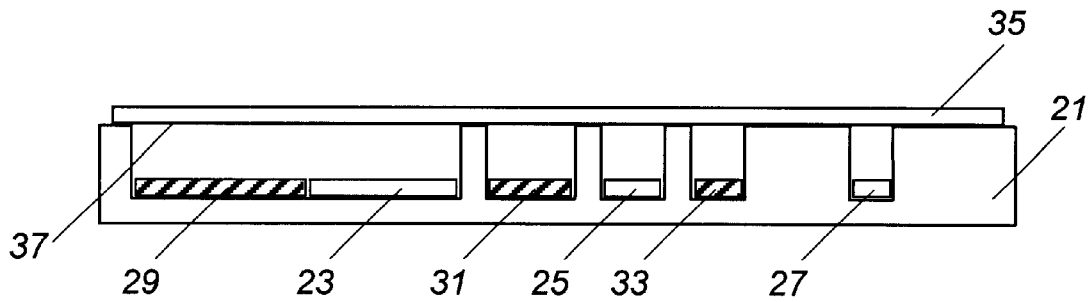
FIG. 4 is a cross-sectional view of an integrated microelectronic assembly (packaged microelectronic device) according to the present invention.

FIG. 3 is a top-view of the container 21 for housing the microelectronic device (or devices) according to the present invention, with FIG. 4 showing a cross-section of the sealed package having GaAs MMICs 23, 25 and 27 in various cavities of the container 21, and having alumina substrates 29, 31 and 33 in various cavities of the container 21. In FIG. 4, lid 35, having a hydrogen gettering structure 37 according to the present invention (that is, a sequentially deposited layers of metal layers) is shown. The hydrogen getter metals are deposited on the lid, and the package is air-tightly sealed by, e.g., laser welding the lid 35 to the container 21.

Figure 5:
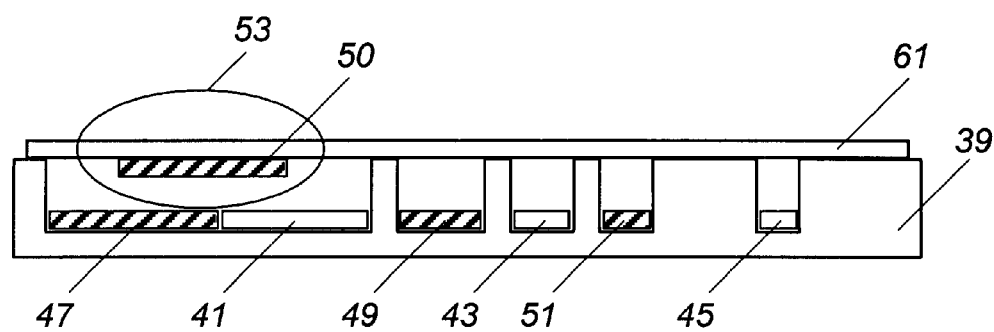
FIG. 5 is a cross-sectional view of an integrated microelectronic assembly (packaged microelectronic device) according to another embodiment of the present invention.
Figure 6:
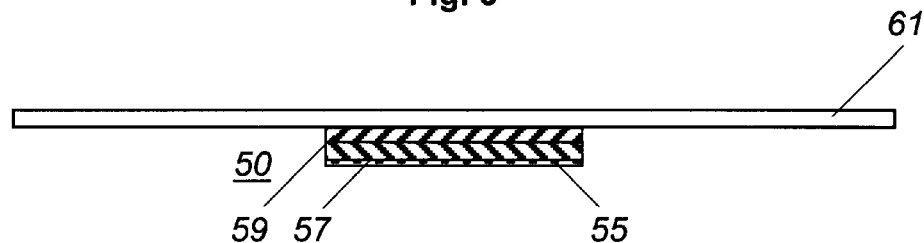
FIG. 6 is a cross-sectional view, in greater detail, of a portion of FIG. 5.

FIGS. 5 and 6 show another embodiment of the present invention. A top view of the container 39 in FIG. 5 would be the same as the top view of the container shown in FIG. 3. In FIG. 5, GaAs MMICs 41, 43 and 45 are provided in various cavities in the container 39. Alumina substrates 47, 49 and 51 are also provided in various of the cavities of container 39, similar as with the embodiment shown in FIG. 4. A lid 61 is air-tightly sealed on the container 39, e.g., by laser welding. The hydrogen gettering structure 50 according to the present invention is attached to the inside surface of lid 61, at a location of a cavity formed by container 39, and is shown within circle 53 in FIG. 5 and in more detail in FIG. 6. Thus, the hydrogen gettering structure shown in FIG. 6 includes the sequentially deposited layers of metal layers 55, as discussed previously. The sequentially deposited layers of metal layers 55 is deposited on, e.g., an aluminum sheet 57 (e.g., having a thickness of 10 mil). The aluminum sheet 57, having the sequentially deposited layers of metal layers 55 deposited thereon, is attached to the interior surface of lid 61 by an appropriate adhesive 59. Thus, this embodiment of the present invention shows that the sequentially deposited layers of metal layers need not be directly in contact with the housing member surface to which the sequentially deposited layers is attached.

The layers of the sequentially deposited layers can be formed conventionally, utilizing conventional deposition techniques. For example, the layers of, e.g., nickel, titanium and palladium can be deposited by vacuum evaporation or sputtering.

The packages formed according to the present invention, incorporating the packaging component having sequentially deposited layers of metal layers, can be assembled utilizing conventional processing techniques. Thus, the microelectronic device incorporated within the package can be adhered to the container bottom, e.g., by use of an adhesive or by eutectic bonding. Moreover, the lid can be attached to the container, to form the air-tightly (hermetically) sealed package, utilizing, e.g., laser welding. These processing techniques are illustrative, and are not limiting of the present invention.

As mentioned previously, the present invention is particularly advantageous in connection with packaging pseudomorphic high electron mobility transistor of a monolithic millimeter wave integrated circuit, which has a thin nitride as a passivation layer and is particularly sensitive to hydrogen degradation. However, any, e.g., microelectronic device can be incorporated in the package of the present invention, having the sequentially deposited layers of metal layers. Moreover, the present invention is also highly advantageous in connection with packaging other high electron mobility transistors, including indium phosphide high electron mobility transistors, and in packaging MESFETs, which are particularly sensitive to hydrogen.

As an additional feature of the present invention, the surface of the housing member upon which the sequentially deposited layers of metal layers is provided (or, more generally, the surface, such as the housing member surface or aluminum sheet surface, upon which the sequentially deposited layers of metal layers is deposited), is roughened prior to depositing the sequentially deposited layers of metal layers. This increases the hydrogen absorption efficiency of the sequentially deposited layers. Illustratively, and not limiting, the metal surface area of the sequentially deposited layers can be increased by grinding the surface of the housing member, with, for example, 150 grid paper. Thus, according to this feature of the present invention the housing member has a roughened surface so as to increase the metal surface area of the sequentially deposited layers of metal layers and increase hydrogen absorption efficiency of the sequentially deposited layers. In addition to the increase of hydrogen absorption rate, it improves adhesion of the sequentially deposited metals and it will prevent from peeling off after hydrogen absorption.

While several embodiments in accordance with the present invention have been shown and described, it is understood that the present invention is not limited thereto, but is susceptible of numerous changes and modifications as known to those skilled in the art. Therefore, I do not wish to be limited to the details shown and described herein, but intend to cover all such changes and modifications as are encompassed by the scope of the appended claims, including equivalents thereof.

What is claimed is:

1. A component for forming a sealed package that includes a microelectronic device, comprising:

a housing member: and sequentially deposited layers of metal layers, attached to the housing member, to be positioned within the package when components of the package are assembled to form the package, said sequentially deposited layers of metal layers including an absorbing layer of a first metal for absorbing hydrogen, and an outermost layer of different metal than said first metal of the absorbing layer, the metal of the outermost layer converting hydrogen molecules to hydrogen atoms and also absorbing hydrogen, the sequentially deposited layers of metal layers further including at least one further absorbing layer of said first metal for absorbing hydrogen.

2. The component according to claim 1, wherein said first metal of each absorbing layer is selected from the group consisting of titanium and zirconium, and said metal that converts hydrogen molecules to hydrogen atoms and absorbs hydrogen is palladium.

3. The component according to claim 2, wherein the outermost layer has a thickness of 300–500 Å; and each absorbing layer has a thickness of 300–10,000 Å.

4. The component according to claim 1, wherein said housing member is a lid.

5. The component according to claim 1, wherein said housing member is a container for holding the microelectronic device.

6. The component according to claim 1, wherein the outermost layer has a thickness of 300–500 Å; and each absorbing layer has a thickness of 3,000–10,000 Å.

7. The component according to claim 1, wherein the first metal of the absorbing layer retains absorbed hydrogen to a higher temperature than does the metal of the outermost layer, and absorbs larger amounts of hydrogen than does the metal of the outermost layer.

8. The component according to claim 1, wherein the sequentially deposited layers of metal layers includes a first layer of another metal, closest to the housing member, adhering to the housing member and which traps hydrogen.

9. The component according to claim 8, wherein the sequentially deposited layers of metal layers includes at least a second layer of said another metal.

10. A packaged microelectronic device, comprising:
(1) a plurality of components for forming the sealed package, the plurality of components including a container for holding the microelectronic device and a lid, and
(2) said microelectronic device, which is adhered to a bottom of said container, the lid being sealed to the container by an air-tight seal, wherein the plurality of components includes said component according to claim 1.

11. The packaged microelectronic device according to claim 10, wherein the air-tight seal is a laser weld between the lid and the container.

12. The packaged microelectronic device according to claim 10, wherein said microelectronic device includes at least one of a MISFET and a high electron mobility transistor.

13. The packaged microelectronic device according to claim 10, wherein each of said lid and said container is made of a material selected from the group consisting of aluminum and alloys thereof, iron and alloys thereof and ceramic material.

14. The packaged microelectronic device according to claim 13, wherein the component having the sequentially deposited layers of metal layers is said lid.

15. The packaged microelectronic device according to claim 13, wherein the component having the sequentially deposited layers of metal layers is said container.

16. The packaged microelectronic device according to claim 10, wherein the component having the sequentially deposited layers of metal layers is said lid.

17. The packaged microelectronic device according to claim 10, wherein the component having the sequentially deposited layers of metal layers is said container.

18. A component for forming a sealed package that includes a microelectronic device, comprising:
a housing member, and
sequentially deposited layers of metal layers attached to the housing member, to be positioned within the package when components of the package are assembled to form the package, said sequentially deposited layers of metal layers comprising a first layer of a first metal, closest to the housing member, adhering to the housing member and which traps hydrogen; a second layer further from the housing member than the first layer, said second layer being of a second metal for absorbing larger amounts of hydrogen than trapped by said first layer, said second layer being adjacent the first layer; and an outermost layer of a third metal that converts hydrogen molecules to hydrogen atoms and also absorbs hydrogen, adjacent the second layer, the first, second and third metals being different metals.

19. The component according to claim 18, wherein the housing member is a lid.

20. The component according to claim 18, wherein the housing member is a container for holding the microelectronic device.

21. The component according to claim 18, wherein the first layer is directly in contact with the housing member.

22. The component according to claim 21, wherein the first layer adheres to a surface of the housing member.

23. A packaged microelectronic device, comprising (1) a plurality of components for forming the sealed package, the plurality of components including a container for holding the microelectronic device and a lid, and (2) said microelectronic device, which is adhered to a bottom of said container, the lid being sealed to the container by an air-tight seal, wherein the plurality of components includes said component according to claim 18.

24. The packaged microelectronic device according to claim 23, wherein said microelectronic device includes at least one of a MISFET and a high electron mobility transistor.

25. The packaged microelectronic device according to claim 23, wherein each of said lid and said container is made of a material selected from the group consisting of aluminum and alloys thereof, iron and alloys thereof and ceramic material.

26. A component for forming a sealed package that includes a microelectronic device, comprising:
a housing member; and
sequentially deposited layers of metal layers, attached to the housing member, to be positioned within the package when components of the package are assembled to form the package, said sequentially deposited layers of metal layers including a first layer, closest to the housing member, of nickel; a second layer, of a material selected from the group consisting of titanium and zirconium, adjacent the first layer, of nickel; and an outermost layer, of palladium, the second layer being adjacent the outermost layer and between the first layer and the outermost layer.

27. A packaged microelectronic device, comprising (1) a plurality of components for forming the sealed package, the plurality of components including a container for holding the microelectronic device and a lid, and (2) said microelectronic device, which is adhered to a bottom of said container, the lid being sealed to the container by an air-tight seal, wherein the plurality of components includes said component according to claim 26.

28. The packaged microelectronic device according to claim 27, wherein the air-tight seal is a laser weld between the lid and the container.

29. The packaged microelectronic device according to claim 27, wherein said microelectronic device includes at least one of a MISFET and a high electron mobility transistor.

30. The packaged microelectronic device according to claim 27, wherein each of said lid and said container is made of a material selected from the group consisting of aluminum and alloys thereof, iron and alloys thereof and ceramic material.

31. A packaged microelectronic device, comprising:
a plurality of components forming a sealed package, the plurality of components including a container for holding a microelectronic device and a lid, and
said microelectronic device, which is a pseudomorphic high electron mobility transistor, having a thin nitride passivation film which is sufficiently thin so as to be susceptible to hydrogen, and which is adhered to a bottom of said container, the lid being sealed to the container by an air-tight seal, wherein the package contains a component comprising sequentially deposited layers of metal layers, attached to the inside of the container, said sequentially deposited layers of metal layers including an absorbing layer of a metal for absorbing hydrogen, and an outermost layer of a different metal than the metal of the absorbing layer, the metal of the outermost layer converting hydrogen molecules to hydrogen atoms and also absorbing hydrogen, the sequentially deposited layers of metal layers further including at least one further layer of the absorbing layer of the metal for absorbing hydrogen.

32. The package microelectronic device according to claim 31, wherein the pseudomorphic high electron mobility transistor forms a monolithic millimeter wave integrated circuit sealed in the package.

33. The packaged microelectronic device according to claim 32, wherein the monolithic millimeter wave integrated circuit includes GaAs semiconductor material.

34. A packaged microelectronic device, comprising:
a plurality of components for toning a sealed package, the plurality of components including a container for holding a microelectronic device and a lid, and
said microelectronic device, which is a pseudomorphic high electron mobility transistor having a thin nitride passivation film which is sufficiently thin so as to be susceptible to hydrogen penetration, said microelectronic device being adhered to a bottom of said container, the lid being sealed to the container by an air-tight seal, wherein the package contains a component comprising sequentially deposited layers of metal layers attached to the inside of the container, said sequentially deposited layers of metal layers comprising a first layer of a first metal, closest to the container, adhering to the container and which traps hydrogen; a second layer further from the container than the first layer, said second layer being of a second metal for adsorbing larger amounts of hydrogen than trapped by said first layer; and an outermost layer of a third metal that converts hydrogen melecules to hydrogen atoms and also absorbs hydrogen, adjacent the second layer, the first, second and third metals being different metals.

35. The packaged-microelectronic device according to claim 34, wherein the pseudomorphic high electron mobility transistor forms a monolithic millimeter wave integrated circuit sealed in the package.

36. The packaged microelectronic device according to claim 35, wherein the monolithic millimeter wave integrated circuit includes GaAs semiconductor material.

37. A packaged microelectronic device, comprising:
a plurality of components forming a sealed package, the plurality of components including a container for holding a microelectronic device and a lid, and
said microelectronic device, which is a pseudomorphic high electron mobility transistor having a thin nitride passivation film which is sufficiently thin so as to be susceptible to hydrogen penetration, said microelectronic device being adhered to a bottom of said container, the lid being sealed to the container by an air-tight seal, wherein the sealed package includes therein a component comprising sequentially deposited layers of metal layers, attached to the inside of the container, said sequentially deposited layers of metal layers including a first layer, closest to the container, of nickel; a second layer, of a material selected from the group consisting of titanium and zirconium; and an outermost layer, of palladium, the second layer being adjacent the outermost layer and between the first layer and the outermost layer.

38. The packaged-microelectronic device according to claim 37, wherein the pseudomorphic high electron mobility transistor forms a monolithic millimeter wave integrated circuit sealed in the package.

39. The packaged microelectronic device according to claim 38, wherein the monolithic millimeter wave integrated circuit includes GaAs semiconductor material.

* * * * *